(12) United States Patent
Darwish et al.

(10) Patent No.: US 8,912,577 B2
(45) Date of Patent: Dec. 16, 2014

(54) DISTRIBUTED HEATING TRANSISTOR DEVICES PROVIDING REDUCED SELF-HEATING

(71) Applicants: Ali Darwish, Overland Park, KS (US); Hingloi Alfred Hung, Bethesda, MD (US)

(72) Inventors: Ali Darwish, Overland Park, KS (US); Hingloi Alfred Hung, Bethesda, MD (US)

(73) Assignee: The United States of America as represented by the Secretary of the Army, Washington, DC (US)

(*) Notice: Subject to any disclaimer, the term of this patent is extended or adjusted under 35 U.S.C. 154(b) by 34 days.

(21) Appl. No.: 13/622,506

(22) Filed: Sep. 19, 2012

(65) Prior Publication Data
US 2014/0077268 A1 Mar. 20, 2014

(51) Int. Cl.
H01L 29/417 (2006.01)
H01L 23/34 (2006.01)
H01L 27/02 (2006.01)

(52) U.S. Cl.
CPC .......... H01L 23/345 (2013.01); H01L 27/0211 (2013.01)
USPC ................. 257/206; 257/E23.102; 361/129; 438/172; 438/176

(58) Field of Classification Search
CPC . H01L 23/345; H01L 23/367; H01L 27/0211; H01L 27/0292; H01L 29/4238
USPC ............................ 257/206, E23.102; 438/172
See application file for complete search history.

(56) References Cited

U.S. PATENT DOCUMENTS

| 6,586,807 B2* | 7/2003 | Nishida et al. ............. 257/401 |
| 7,598,566 B2* | 10/2009 | Hotta et al. ............... 257/327 |
| 7,741,700 B2* | 6/2010 | Kuroda et al. ............. 257/577 |
| 7,897,461 B2* | 3/2011 | Takami .................... 438/270 |
| 7,923,266 B2* | 4/2011 | Thijs et al. ................. 438/14 |
| 8,022,470 B2* | 9/2011 | Hirler ..................... 257/328 |
| 8,558,281 B1* | 10/2013 | Regan et al. .............. 257/194 |

OTHER PUBLICATIONS

Darwish, A.M., Hung, H.A., & Ibrahim, A.A., "AlGaN/GaN HEMT With Distributed Gate for Channel Temperature Reduction," IEEE Transactions on Microwave Theory and Techniques, vol. 60, No. 4, pp. 1038-1043, Apr. 2012 (available online Feb. 17, 2012).

Darwish, A.M. & Hung. H.A, "Improving Thermal Reliability of FETs and MMICs," Device and Materials Reliability, IEEE Transactions on Device and Materials Reliability, vol. 11. No. 1, pp. 164-170, Mar. 2011.

Darwish, A.M., Bayba, A.J., & Hung, H.A., "Accurate determination of thermal resistance of FETs," IEEE Transactions on Microwave Theory and Techniques, vol. 53, No. 1, pp. 306-313, Jan. 2005.

Darwish, A.M., Hung, H.A., Bayba, A.J., & El-Kinawi, K., "Accurate Calculation of Junction Temperature of HBTs," IEEE Transactions on Microwave Theory and Techniques, vol. 59, No. 3, pp. 652-659, Mar. 2011.

* cited by examiner

*Primary Examiner* — John C Ingham
(74) *Attorney, Agent, or Firm* — Eric B. Compton

(57) ABSTRACT

According to various embodiments, a distributed heating transistor includes: a plurality of active regions where transistor action occurs including a heat source; and at least one inactive region where transistor action does not occur and no heat source is present, wherein adjacent active regions are separated by the at least one inactive region. The distributed heating transistor may be configured as field effect transistors (FETs), and bipolar junction transistors (BJTs). Methods for forming the distributed heating transistors are also provided.

20 Claims, 17 Drawing Sheets

*CONVENTIONAL*

*ONE EMBODIMENT OF INVENTION*

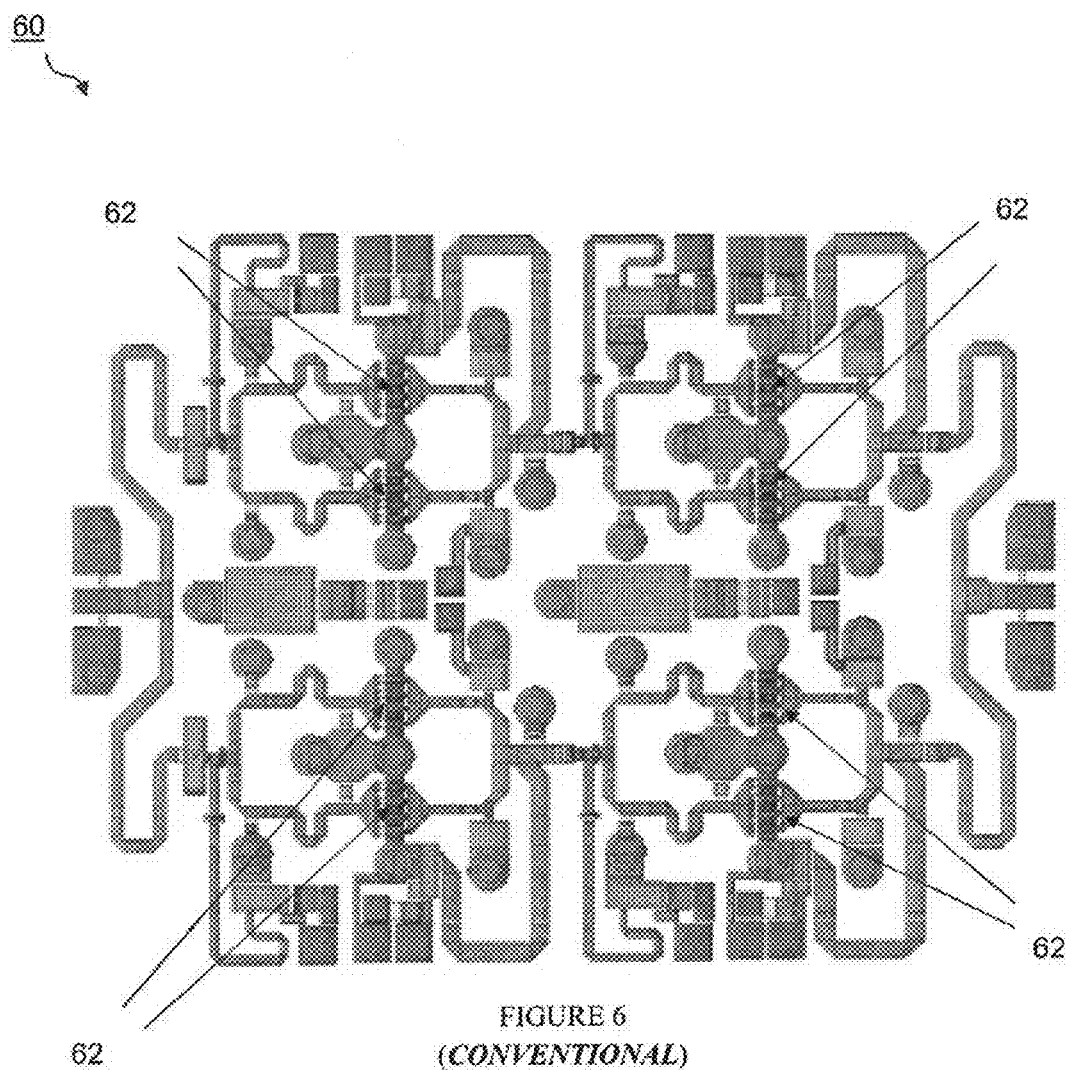
FIGURE 6
(CONVENTIONAL)

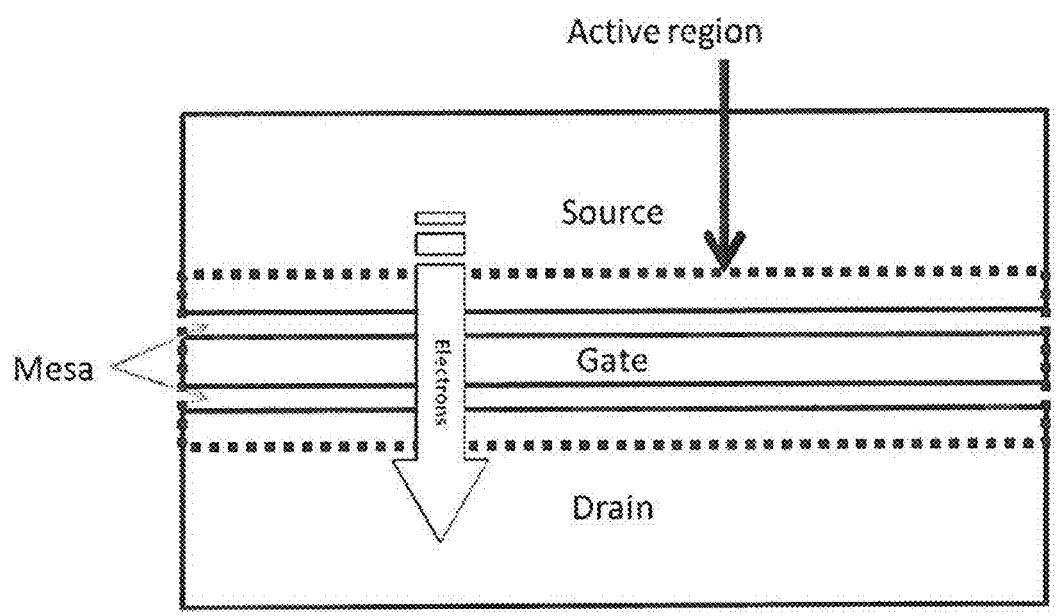
FIGURE 11
(CONVENTIONAL)

DISTRIBUTED HEATING TRANSISTOR DEVICES PROVIDING REDUCED SELF-HEATING

GOVERNMENT INTEREST

Governmental Interest—The invention described herein may be manufactured, used and licensed by or for the U.S. Government without the payments of royalties thereon.

BACKGROUND OF THE INVENTION i) Field of Invention

Embodiments of the present invention generally relate to transistors, and in particular to distributed heating (DH) transistor devices providing reduced self-heating.

ii) Description of Related Art

Electronic devices and integrated circuits have performance limits that are frequently set by the maximum allowable current density, voltage/electric field, and channel (or junction) temperature. Self-heating of these devices is undesirable as it reduces performance and lifetime. The channel temperature $T_c$ is correlated with the device lifetime through the Arrhenius equation, and may be determined through simulations, theoretical models, or experimentally. Channel temperature directly affects the bandgap, electron mobility, electron saturation speed, pinch-off voltage, breakdown voltage, transconductance, saturation current, output power, and noise performance.

Reducing $T_c$ typically leads to enhanced device performance, and reliable, sustainable operation. Heating in transistors may lead to memory effects which cause linearity degradation. Channel temperature is directly proportional to power dissipation through the thermal resistance constants. It also depends critically on the device layout. In the case of field effect transistors (FETs) and high electron mobility transistors (HEMTs), $T_c$ increases with the thermal resistance constant, and depends on the gate-width, gate-length, gate-pitch, and substrate thickness and thermal conductivity. Transistor heating is a primary cause of memory effects which degrade linearity of power amplifiers, especially for modulated signals, for instance.

Conventional approaches, such as increasing gate-pitch dimension, result in larger device size and performance degradation especially at millimeter-wave frequencies. Additionally, transistor heating is a cause of memory effects which degrade linearity of power amplifiers, especially for modulated signals.

BRIEF SUMMARY OF THE INVENTION

Embodiments of the present invention relate to transistor devices.

According to one embodiment, a distributed heating transistor includes: a plurality of active regions where transistor action occurs including a heat source; and at least one inactive region where transistor action does not occur and no heat source is present, wherein adjacent active regions are separated by the at least one inactive region.

According to another embodiment, a method of fabricating a distributed heating transistor includes: forming a plurality of active regions where transistor action occurs including a heat source and at least one inactive region where transistor action does not occur and no heat source is present, wherein adjacent active regions are separated by the at least one inactive region.

In various embodiments, the distributed heating transistor may be configured as field effect transistors (FETs), and bipolar junction transistors (BJTs). If the transistor is configured as a field effect transistor (FET), it may include: a source; a gate; and a drain, wherein the heat source is in the vicinity of the gate due to the flow of electrons or holes from the source to the drain via the gate, and the gate includes a plurality of active region with adjacent active regions being separated by an inactive region. And, if the transistor is configured as a bipolar junction transistor (BJT), it may include: an emitter; a base; and a collector, wherein the heat source is in the vicinity of the emitter due to the flow of electrons or holes from the emitter to the collector via the base, and the emitter, the base, and/or the collector include a plurality of active regions with adjacent active regions being separated by an inactive region.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. Unless otherwise stated, relative sizes of the features illustrated in the drawings are not to scale. It is to be noted, however, that the appended drawings illustrate only a few embodiments of this invention and are therefore not to be considered limiting of its scope, for the invention may admit to other equally effective embodiments. These embodiments are intended to be included within the following description and protected by the accompanying claims.

FIG. 6 illustrates a layout of a conventional power amplifier MMIC, showing multiple HEMT cells, with each of the HEMT cells having multiple gate strips.

FIG. 11 shows the top view of a conventional FET.

FIG. 12A shows a top view, FIG. 12B shows a cross-sectional view along line A-A' in FIG. 12A and FIG. 12C shows a three-dimensional isometric view. As shown, the active regions and the inactive region form a gate strip.

FIG. 14A shows a top view, FIG. 14B shows a cross-sectional view along line A-A' in FIG. 14A and FIG. 14C shows a three-dimensional isometric view.

DETAILED DESCRIPTION OF THE INVENTION

According to embodiments of the present invention, distributed heating transistors are disclosed in which heat-generating regions are separated into several active and inactive regions, thereby reducing self-heating. Simulations and experimental verification indicate a significant heat reduction as a result of these structures leading to improvements in device performance.

There are two main classifications of transistors in terms of construction and function: (i) field effect transistors (FETs), and (ii) bipolar junction transistors (BJTs). Both FET and BJT transistors can be implemented in a variety of different ways using different semiconductor materials formed on a substrate by typical semiconductor fabrication processes.

For example, Gallium Nitride (GaN) high-electron mobility transistors (HEMTs) are one implementation of FETs. Similarly, Gallium Arsenide (GaAs) hetero junction bipolar transistors (HBTs) are an implementation of BJTs. When transistors are operated, they consume power from a direct current (DC) source or from an alternating current (AC) source. Part of this power is dissipated in the form of heat. Table 1, below, shows the electrical schematic, and heat source and sink areas for a FET, and a BJT, respectively. In the table, the symbol for a NPN-type BJT is shown. A PNP-type BJT might be used depending on desired polarity.

TABLE 1

Transistor Types

| Transistor type | FET | BJT |
|---|---|---|
| Electrical Schematic | 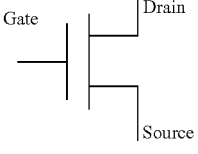 | 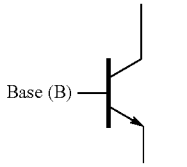 |
| Heat Source | close to gate | close to emitter |
| Heat Sink | Substrate | Substrate |

Heating in transistors affects the electrical performance adversely, in most cases. As such, it is desirable to reduce heating temperature. Most of the heating in FETs happens close to the gate junction, and in BJTs it happens close to the emitter junction.

Figure 1:
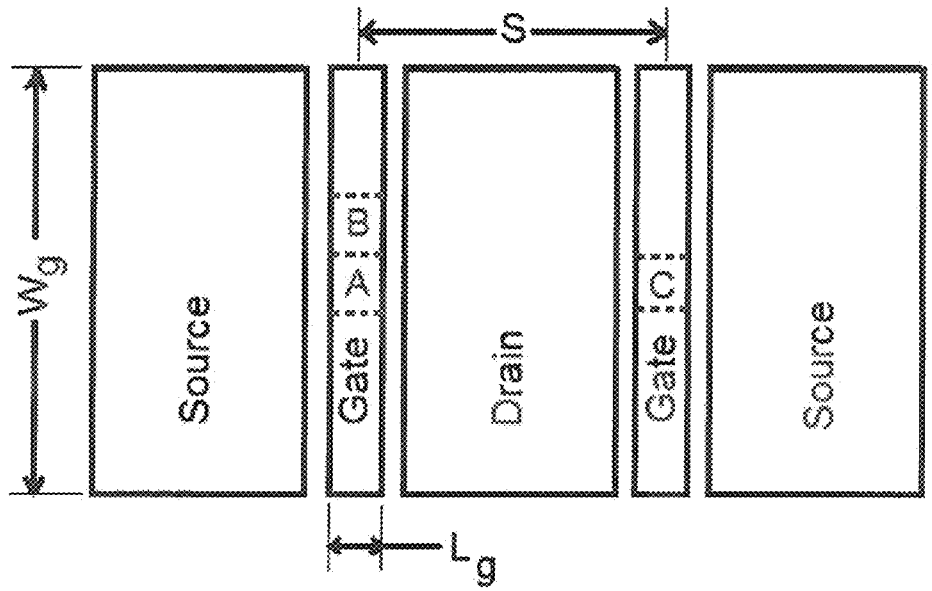
FIG. 1 illustrates a schematic of a high electron mobility transistor (HEMT) layout that was analyzed by the inventors.

FIG. 1 illustrates a schematic of a HEMT layout that was analyzed by the inventors. The actual HEMT device for which this layout corresponds to is conventional, but not shown. As noted above, the HEMT is one type of FET.

The transistor structure may be considered a plurality of highly localized heat sources on a substrate having a thickness t. Here, the heat sources represent the gates of the device with a length $L_g$, a width $W_g$ and a gate pitch S. The semiconducting region directly below the gate is called the channel. The semiconducting channel may be formed from a semiconductor material such as gallium nitride (GaN), for instance. Other semiconductor materials may also be used to form the semiconducting channel. Here, the thermal conductivities of the semiconductors and substrate are $k_{GaN}$, and $k_{sub}$, respectively.

The channel temperature may be calculated using a numerical simulator or the closed form expression. For instance, in FIG. 1, the temperature in section A of the gate strip may be influenced by, (a) the self-heating of the active area in A, (b) the cross-heating caused by nearby active sections in the same gate strip, such as section B, and (c) the heating effect from neighboring gates, such as section C. Reducing the temperature may be accomplished by reducing the self-heating from each section and the contributions of near-by or adjacent sections.

In the case of section A, reducing its self-heating may be accomplished by increasing the gate length $L_g$, and decreasing substrate thickness t, and power dissipation (per mm) of gate width, $P_{mm}$. In a typical device fabrication process, however, $L_g$ and t cannot be readily changed by the designer. Reducing $P_{mm}$ by increasing device power-added-efficiency is a well recognized goal for designers, and it is the focus of numerous research groups. Another option is to reduce cross-heating from neighboring gate-strips (e.g. section C) which can be achieved by increasing the gate-pitch S. Yet, this may come at the expense of larger area, leading to (i) wider drain pads, (thus, a larger drain-source capacitance $C_{ds}$) and, (ii) wider source pads (thus, a greater source inductance $L_s$). Increasing $C_{ds}$, generally reduces bandwidth, gain, and makes it more difficult to match the output of the device. Similarly, increasing $L_s$ leads to lower gain because of its negative feedback effect. Additionally, increasing the gate-pitch may not be advantageous in performance for millimeter-wave devices, since it results in significant phase discrepancies between the center gate strip and the end gate-strips because of the differential signal-path length. Thus, there is a tradeoff between channel temperature and various electrical performance metrics.

Figure 2A:
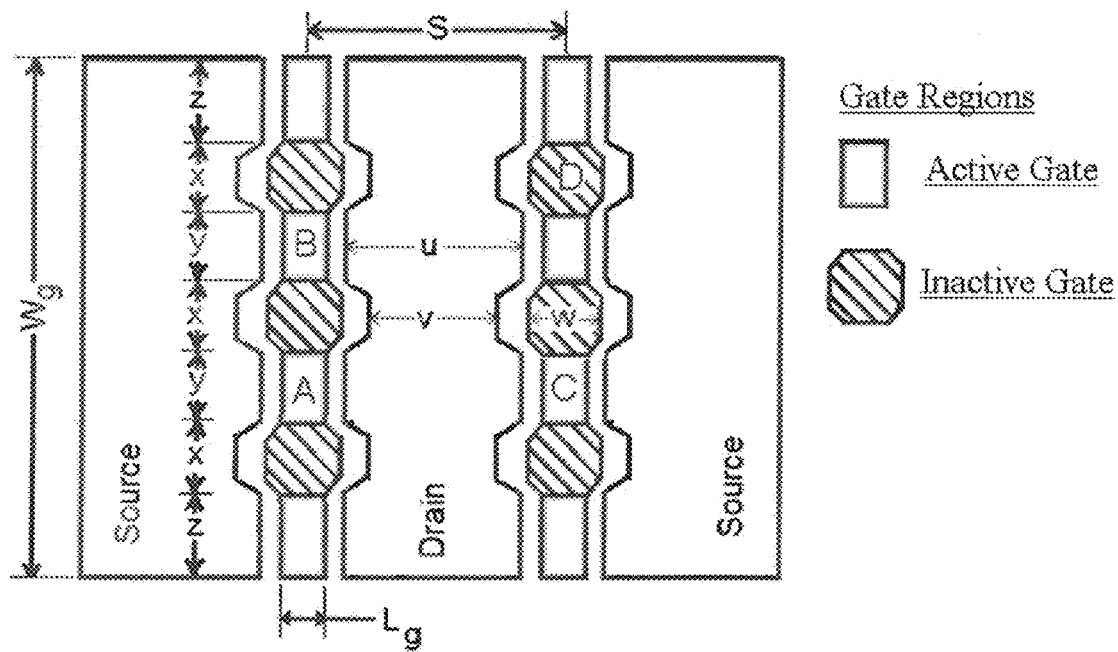
FIG. 2A illustrates a schematic of a DH-HEMT according to an embodiment of the present invention.

FIG. 2A illustrates a schematic of a HEMT according to an embodiment of the present invention. The rectangular areas (e.g. A, B, and C) are active gate segments while the shaded octagonal areas (e.g. D) are inactive segments. As shown here, active areas are segments that function as transistors, while inactive areas do not. Rather, they may include conductive regions. In some embodiments, the active areas may be areas where a transistor channel (e.g., mesa, epitaxial-layer or doped layer) exists while in inactive areas, the transistor channel has been removed (e.g., etched away) and a conductor rests on a passive or semi-insulating semiconductor.

In keeping with the HEMT dimensional designation used in discussing FIG. 1: the vertical scale corresponds with width, and the horizontal scale corresponds with length. The gate length $L_g$ of segments A, B, and C, is the same. Although, it should be appreciated that it may be possible to have gate length $L_g$ different in one or more of segments A, B, and C.

Adjacent active gate segments are connected by inactive segments. Here, the inactive regions are configured as islands (e.g. island D) having width x, and length w. Although, in other embodiments, the inactive regions might be differently configured, such as, for example, as pads. For example, the islands may be formed of various types of conductors depending on the fabrication process. For some semiconductors, gold, aluminum, tungsten, or copper may be used. The metal may include multiple metal layers for instance. In one embodiment, a very thin layer of titanium may be deposited first, and then a thin layer of gold deposited. The titanium layer may help attachment of the gold to the very smooth semiconductor surface. For silicon-based transistors, connections may be made using "poly-silicon," a non-metal.

In various embodiments, $W_g$ may be in the range of 10-1000 μm, x, y and z in the range of 2-50 μm, and S in the range of 5-300 μm, for instance.

Figure 2B:
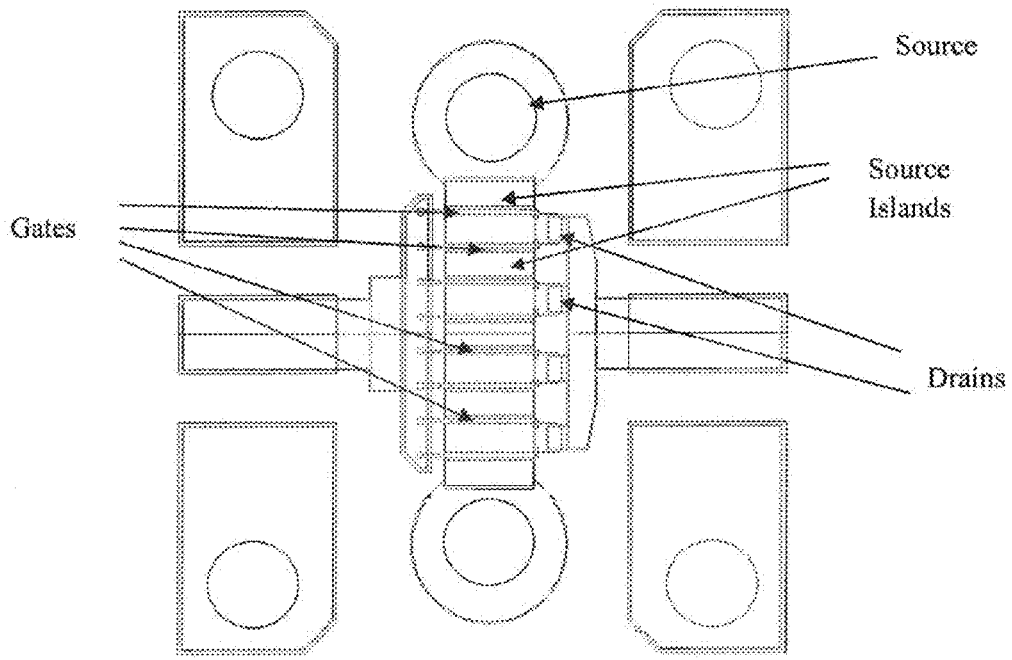
FIG. 2B illustrates a conventional HEMT layout (on the top) compared with a DH-HEMT layout (on the bottom) according to an embodiment of the present invention.
Figure 2B:
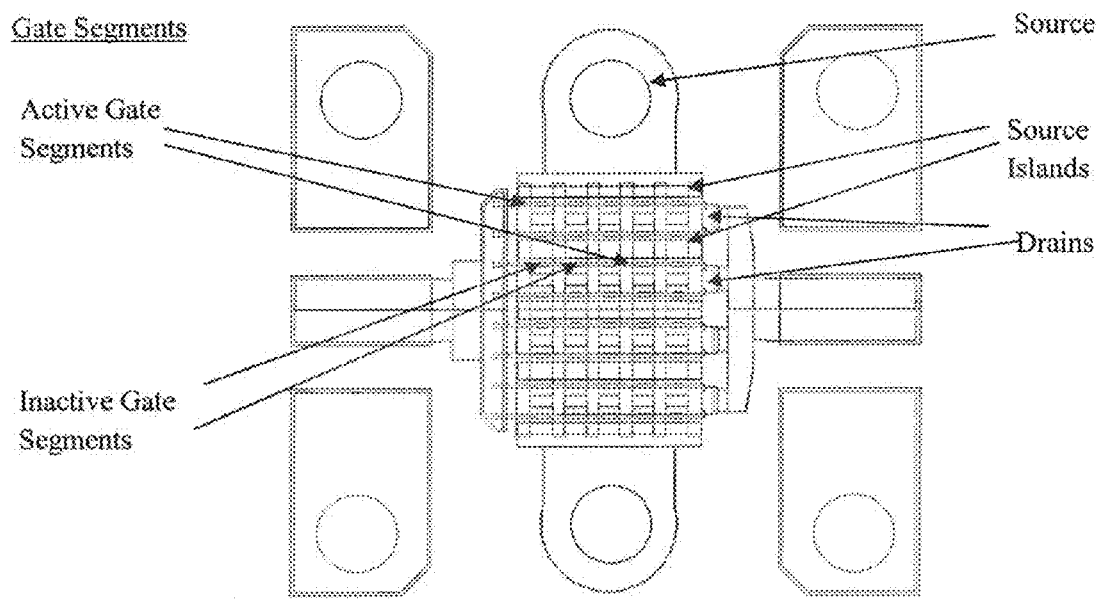

FIG. 2B illustrates a conventional HEMT layout (on the top) compared with a DH-HEMT layout (on the bottom) according to an embodiment of the present invention. For comparisons between the DH-HEMT and the conventional HEMT, the active gate width (i.e., the sum of y and z segments for the DH-HEMT) was kept the same.

According to various aspects of the invention, reducing the channel temperature of one or more sections along a gate-strip, for example, may be accomplished by decreasing cross heating from nearby sections, through sectioning or dissecting the gate into separate areas, sections or regions. For instance, to reduce the channel temperature of section A the effect of cross-heating of adjacent section B will be minimized.

The distributed gate transistor structure may reduce heating at the expense of some increase in device area. The gate and drain capacitances may be composed of an epitaxial-based portion (main contribution) and a geometry-based portion (minor contribution). The main contribution is provided by active gate segments while the minor contribution is provided by inactive gate segments.

The increase in device area may add to the gate and drain geometry-based portion of the capacitances. However, it has been found that the increase in area does not produce phase differences in the signal paths among different parallel gate-strips. In FIG. 2A, the region below the rectangular gate areas are active gate regions with widths y, and z, for end segments. In some embodiments, the gate strip may be separated or divided into many segments, depending on $W_g$. For example, for a large $W_g$, there may be more than 10 segments, while for a smaller $W_g$, there may be less than 10 segments. The gate strip may be referred to as a "finger," in some instances.

The segments of the gate may be selectively etched or rendered inactive through other processes, such as ion-implantation, to form the inactive regions (e.g., islands) in the channel depending on the fabrication embodiment utilized. For example, to eliminate the thin active layer (e.g., epitaxial-layer or doped layer), an etching process may be used, resulting in a mesa structure. Other processes, such as ion-implantation, might also be used to convert the active region into an inactive region. The purpose is to prevent those regions from having a transistor function (i.e. they will no longer be active). The length of source and drain strips is u, in active segments, and v, in inactive segments. By choosing v to be less than u, for instance, it is possible to reduce the contributions of the inactive regions with respect to $C_{ds}$ and $C_{gs}$. For example, in some embodiments, $L_g$ may be about 0.1-0.5 μm, while w may be about 5-10 μm to minimize the series resistance of the connecting islands along each gate strip.

Also, the metal thickness may be greater in the connecting islands than that in the active gate regions to reduce series resistivity. The additional metal area may slightly increase the series gate capacitance. When compared to conventional HEMT devices, the DH-HEMT configuration may have a slightly larger area and higher equivalent circuit capacitances and resistances. However, as discussed below, these factors are generally outweighed by the advantages of the DH transistor structure in achieving lower channel temperatures, especially for wide bandgap semiconductor (such as GaN, and SiC) devices, where the performance (e.g., gain, output power, or noise) is frequently limited by heat dissipation.

For comparison between the conventional HEMT, and the DH-HEMT according to an embodiment of the present invention, the active gate width was kept the same. In FIG. 2B, the gate width for the DH-HEMT is the sum of the active areas (i.e., y and z segments). For the DH-HEMT, the insertion of the metal islands (i.e., inactive regions) increases the physical gate width (not the active gate width) of each gate strip. This increases the phase length of each gate-strip and may limit performance at higher frequencies. Care should be taken so that the physical gate width of each strip remains a small fraction of a wavelength.

Figure 2C:
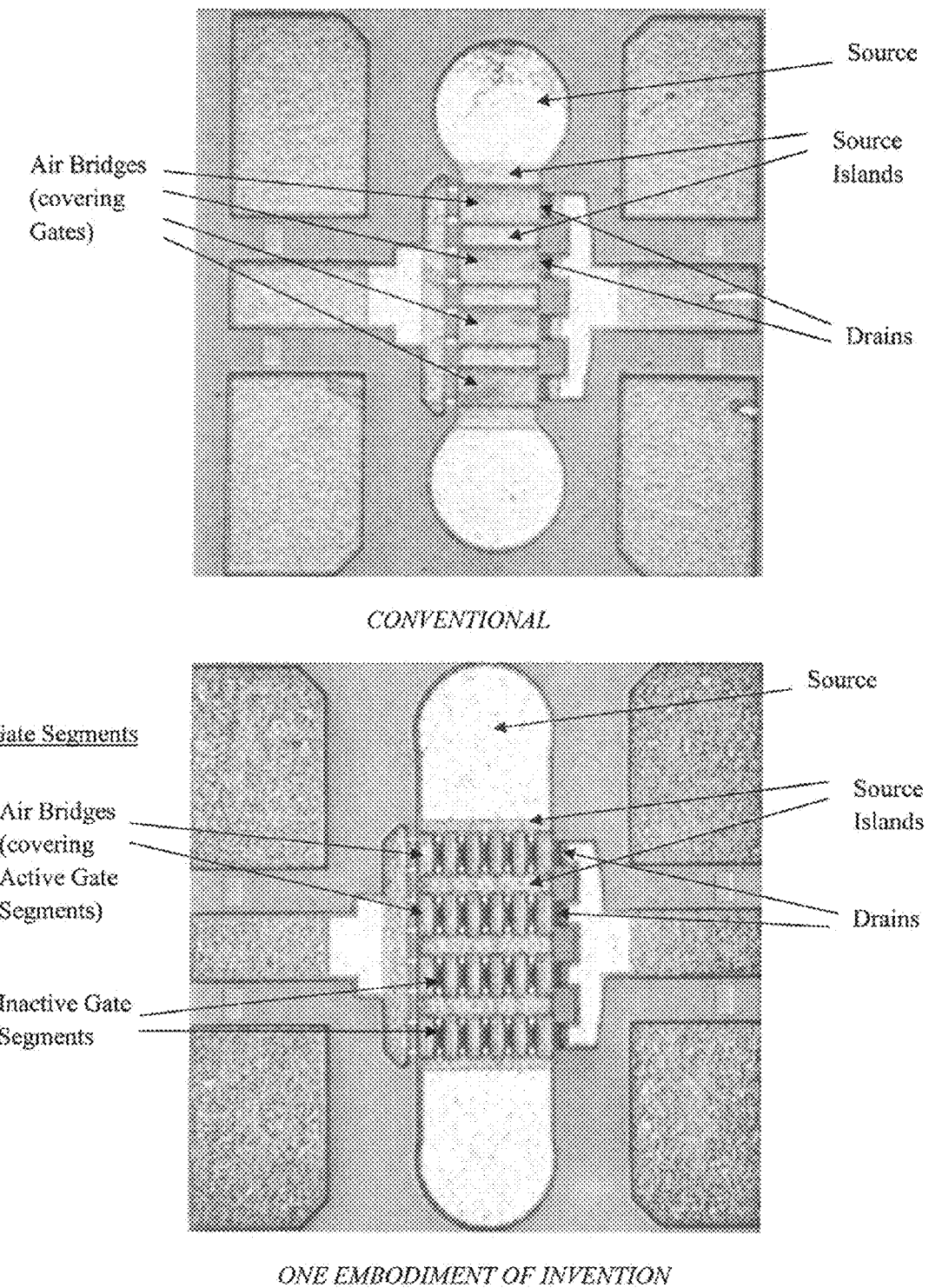
FIG. 2C shows photographs of a conventional HEMT (on the top), and a DH-HEMT (on the bottom) fabricated by the inventors according to an embodiment of the present invention.

FIG. 2C shows photographs of a conventional HEMT (on the top), and a DH-HEMT (on the bottom) fabricated by the inventors according to an embodiment of the present invention. The conventional HEMT includes one 75 μm-wide air-bridge per gate strip connecting each source island (pad). In the DH-HEMT (having 10 μm wide inactive sections), six small air-bridges connecting each source island. As the gap increases, the thermal resistance decreases. The thermal resistance is defined as $\Delta T_c / P_{diss}$, where $\Delta T_c$ is the temperature increase, and $P_{diss}$ is the dissipated power. As a result, the temperature will be lower for DH-HEMTs with greater gaps.

It is noted that FIG. 2B and FIG. 2C show similar items, where FIG. 2B shows design layouts and FIG. 2C shows photograph of actual device fabricated. The gate strips of the DH-HEMT include both active segments and inactive segments. The layouts shown in FIG. 2B, however, do not show all layers in a finished device. In the photographs of FIG. 2C, gates of the conventional HEMT and DH-HEMT are present, but the floating air-bridge electrically connecting the source islands obscure the gates in the conventional HEMT and the active regions in the gate segments of the DH-HEMT. For sake of clarity, not all of the gate strips, source islands, or drains have been annotated in FIG. 2B and FIG. 2C, but are nonetheless shown therein.

To further quantify the discussion, consider as an example a GaN/SiC HEMT with 0.25 μm gate length $L_g$, 600 μm (8×75 μm) gate periphery, 28.5 μm gate pitch S, 100 μm substrate thickness t, dissipating 6 W (30 V×200 mA). The inventors used a numerical simulator (i.e., ANSYS software), with nonlinear thermal conductivity, to calculate the channel temperature variation with inactive gate section width, x.

Figure 3:
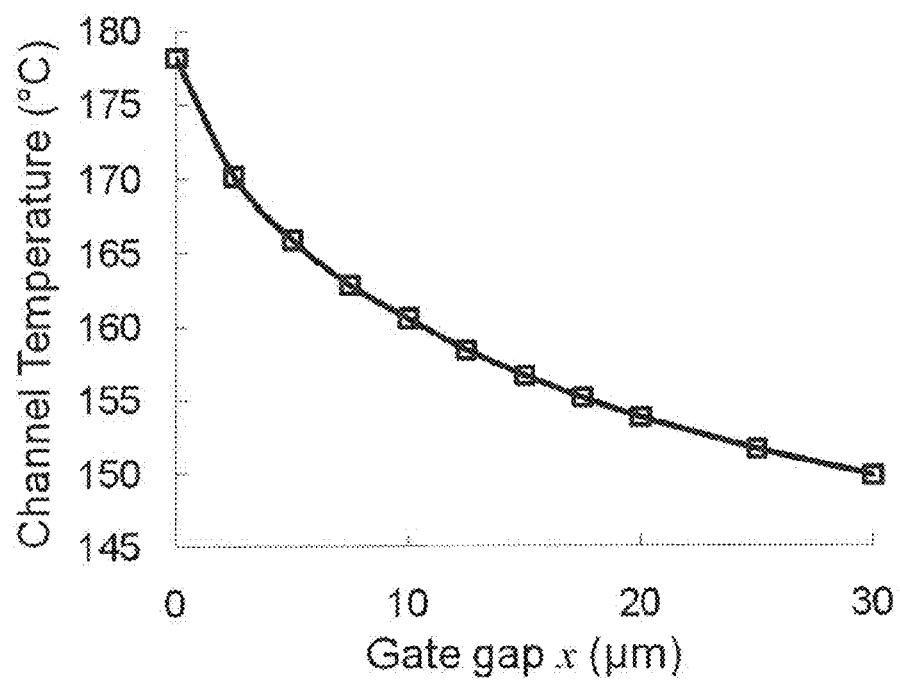
FIG. 3 illustrates a plot of channel temperature as a function of gate inactive section gap.

FIG. 3 illustrates a plot of channel temperature as a function of gate inactive section "gap", x. The plotted channel temperature is at the middle section of the middle strip; the hottest spot. As the inactive section width increases, the temperature decreases quickly.

Figure 4:
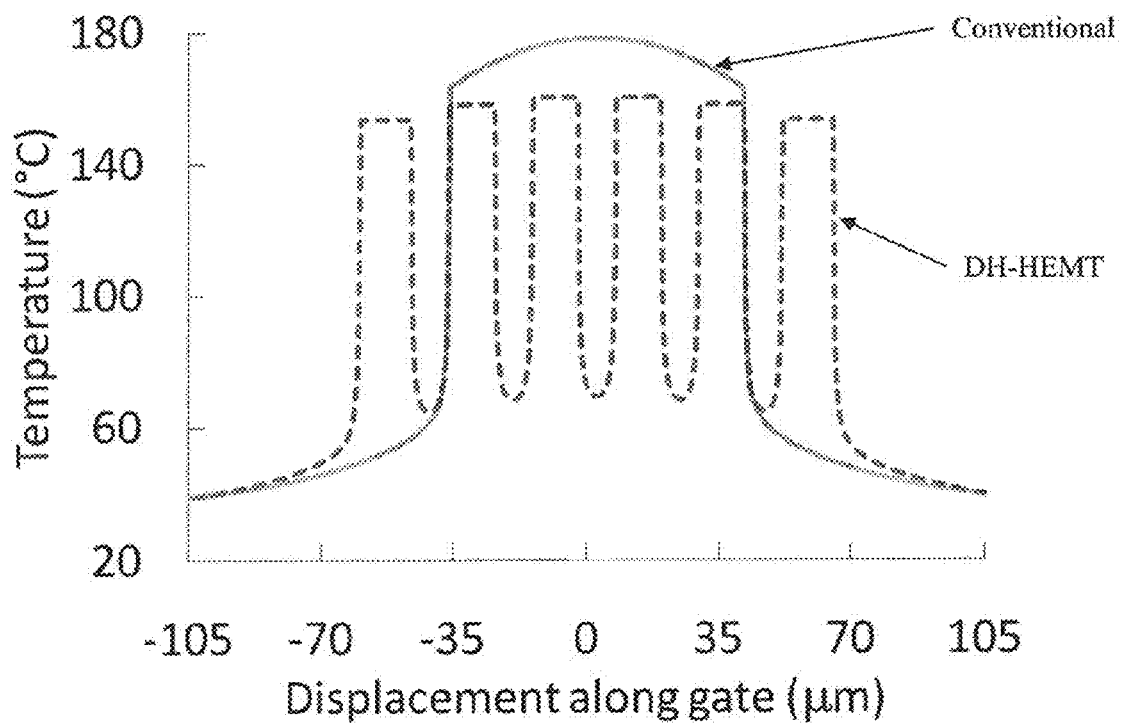
FIG. 4 illustrates a plot of channel temperature along center line for a conventional HEMT, and a DH-HEMT according to an embodiment of the present invention.

FIG. 4 illustrates a plot of channel temperature along center line for both a conventional HEMT (solid line), and a DH-HEMT (dashed line) according to an embodiment of the present invention.

As apparent, the temperature fluctuation for the DH-HEMT is significantly less than that of the conventional HEMT. This is advantageous given that the heat is spread over a wider physical area. Despite the low temperature fluctuation in the DH-HEMT, the middle sections are, to a small extent, hotter than those at the edge. This is a consequence of choosing almost equal width for segments y, and z. The maximum temperature (e.g., in the center) can be reduced by choosing z to be larger than y, in order to shift heating towards the gate strip edges, and away from the center. Designers may also choose to use gate sections of varying widths ($y_1, y_2, \ldots$) to control undesirable heating at the center, or eliminate the active gate section in the center of the HEMT.

Figure 5A:
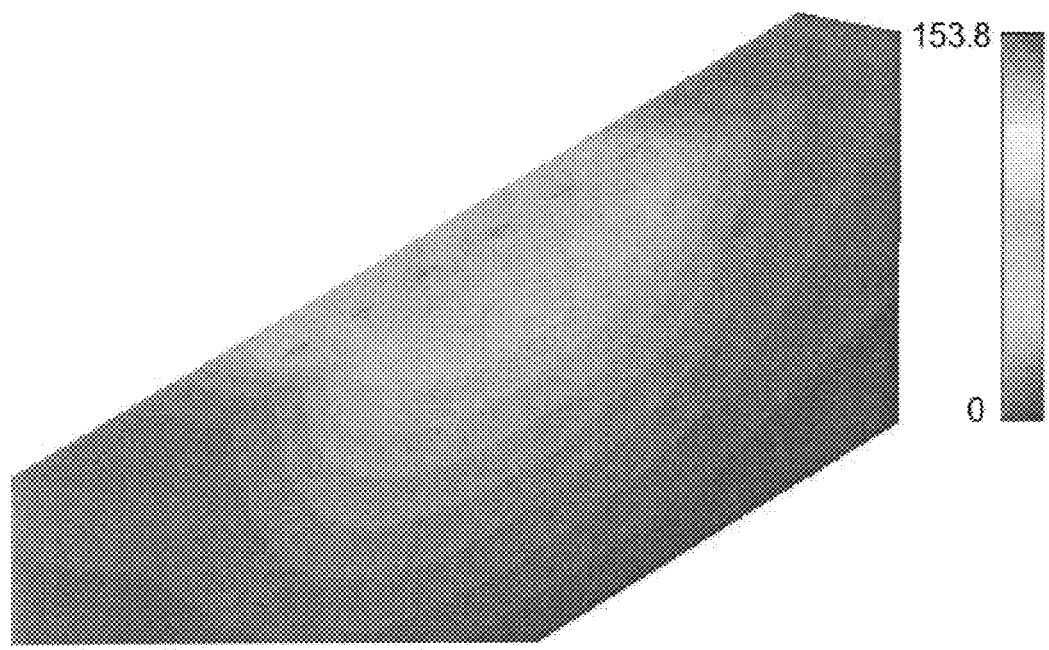
FIGS. 5A and 5B illustrate three-dimensional (3-D) temperature distribution plots for the DH-HEMT according to an embodiment of the present invention.
Figure 5B:
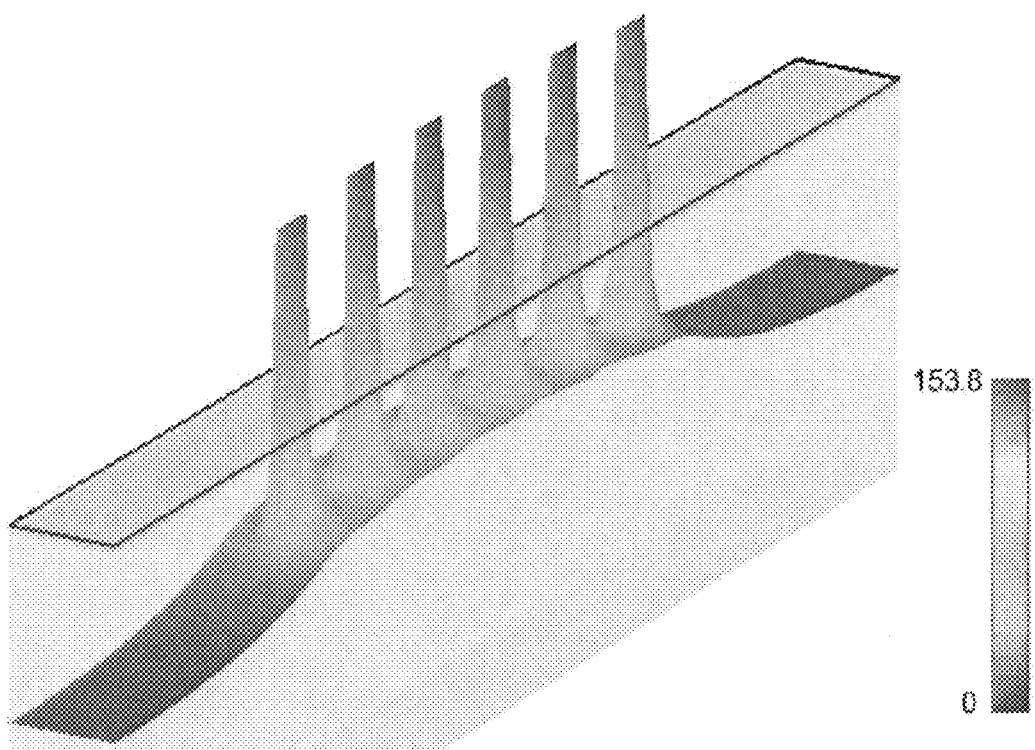

Three-dimensional (3-D) temperature distribution plots for the DH-HEMT are shown in FIGS. 5A and 5B. FIG. 5A shows a contour plot of channel temperature along a gate strip of the DH-HEMT, showing the maximum temperature of 153.8° C. FIG. 5B shows a 3-D plot of channel temperature along a gate strip of the same DH-HEMT corresponding to FIG. 5A. This surface plot shows the temperature profile at the top of the HEMT (i.e., the area enclosed by the black rectangle at the top).

One concern about using the distribute gate transistor configuration is the increase in device area. However, if the total area of a device, such as a power amplifier (PA) Monolithic Microwave Integrated Circuit (MMIC), is considered, then it becomes apparent that the overall area of the device increases only slightly.

FIG. 6 illustrates a layout of a power amplifier MMIC 60 having eight HEMT cells 62, with each of the HEMT cells having multiple gate strips. The MMIC 60 is a conventional circuit and thus, its other components will not be described in further detail herein. The dimensions of each cell is 2.8×2.1 mm, for an area of 5.9 mm². The active HEMT cells 62 occupy about 0.22 mm² of the MMIC 60 footprint, which is less than 4% of the total area. Thus, even if the area of each HEMT 62 was increased by 50%, the total increase in MMIC area would only be around 2% only.

On the other hand, designing the MMIC 60, there may be two options to reduce the channel temperature $T_c$: (i) increasing gate gap x, or (ii) increasing the gate pitch S.

Figure 7A:
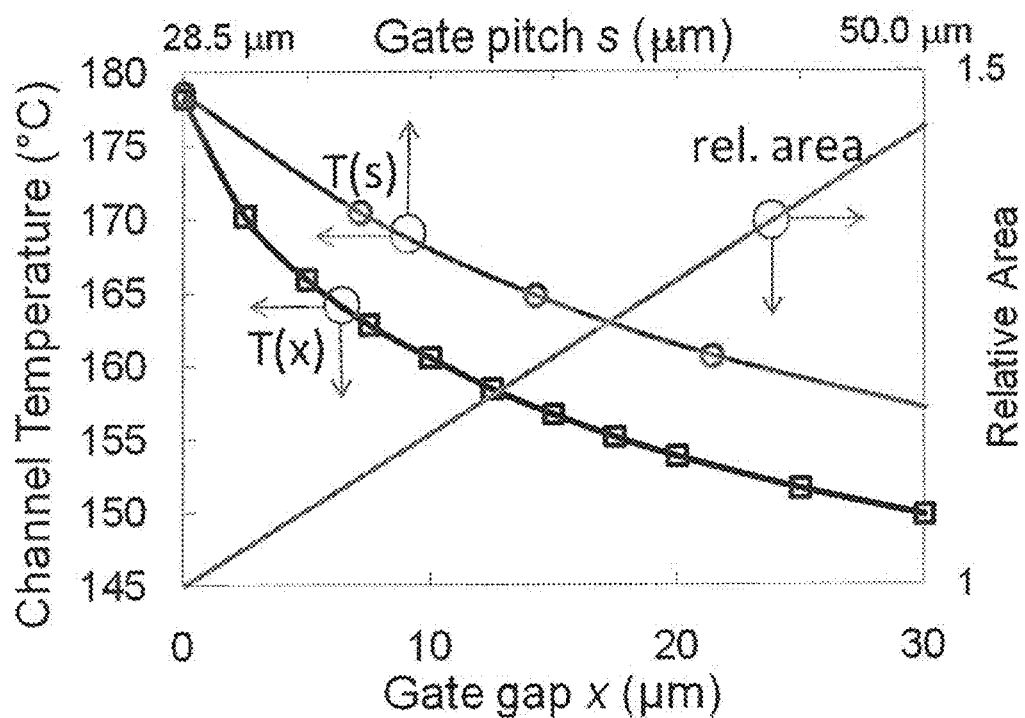
FIG. 7A shows plots of channel temperature $T_c$ and the increase in area, for both options.

FIG. 7A shows plots of channel temperature $T_c$ and the increase in area, for both options. The plot labeled T(x) with square symbols represents variation of channel temperature with gate gap x, while the plot labeled T(s) with circle symbols represents variation with gate pitch S. The relative increase of device area in both cases is the plot labeled "rel. area". The range of gate pitch variation was selected such that it produces the same overall increase in relative area. For example, as the gate gap x increases from 0 to 30 μm, $T_c$ drops from 178.2° C. to 149.8° C., and the device area increases by 45%. Alternatively, if the gate pitch is increased from 28.5 μm to 50 μm, $T_c$ drops from 178.2° C. to 157.1° C., and the area also increases by 45%. Increasing the gate pitch, however, may have a number of undesirable effects on performance, as discussed earlier.

The device reliability is strongly dependent on channel temperature. It may be determined using the Arrhenius equation, as follows:

$$\ln\left(\frac{MTF_2}{MTF_1}\right) = \frac{E_a}{k_b} \cdot \left(\frac{1}{T_2} - \frac{1}{T_1}\right). \quad (1)$$

where $T_1$ and $T_2$ are the channel temperatures in degrees Kelvin, $MTF_1$ and $MTF_2$ are the corresponding mean-time-to-failure or (MTF) values, $E_a$ is the activation energy, and $k_b$ is the Boltzman constant ($8.6 \times 10^{-5}$ eV/K). Evaluating the expression for GaN with $E_a=1.5$ eV, as an example, $T_1=149.8°$ C., and $T_2=178.2°$ C., yields $MTF_2/MTF_1=e^{3.77}=13.4$.

Figure 7B:
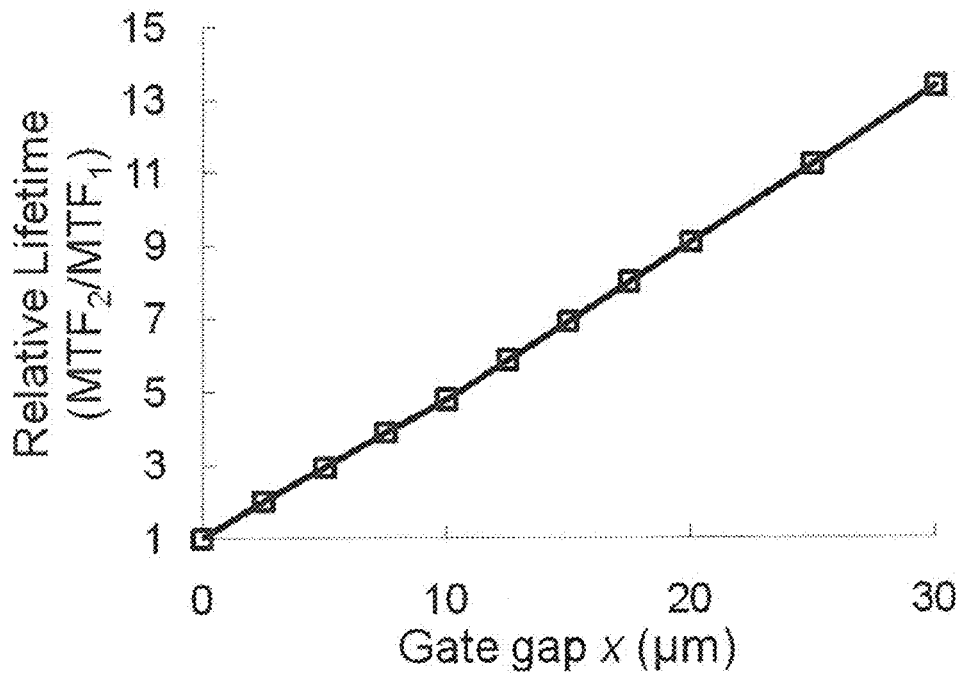
FIG. 7B shows a plot of the relative improvement of lifetime versus gate gap for a DH-HEMT, according to the Arrhenius equation.

FIG. 7B shows a plot of the relative improvement of lifetime ($MTF_2/MTF_1$) versus gate gap for a DH-HEMT according to an embodiment of the present invention based on the Arrhenius equation. Improvement in MTF ratio using $E_a$ values from other researchers can also be readily assessed.

From the foregoing, the inventors appreciated that improved results could be realized by increasing or spreading out the heat generating regions over a larger area. For example, a 75 μm width gate strip may be sectioned into six active segments (having five inactive gate gaps) with x=15 μm. Thus, the total strip width would be 150 μm. Alternately, the gate could be divided or sectioned into two equal active segments with a single 75 μm gap, or three equal active segments with two 37.5 μm gaps. Other gate configurations (e.g., having different number of sections) are also possible.

Figure 7C:
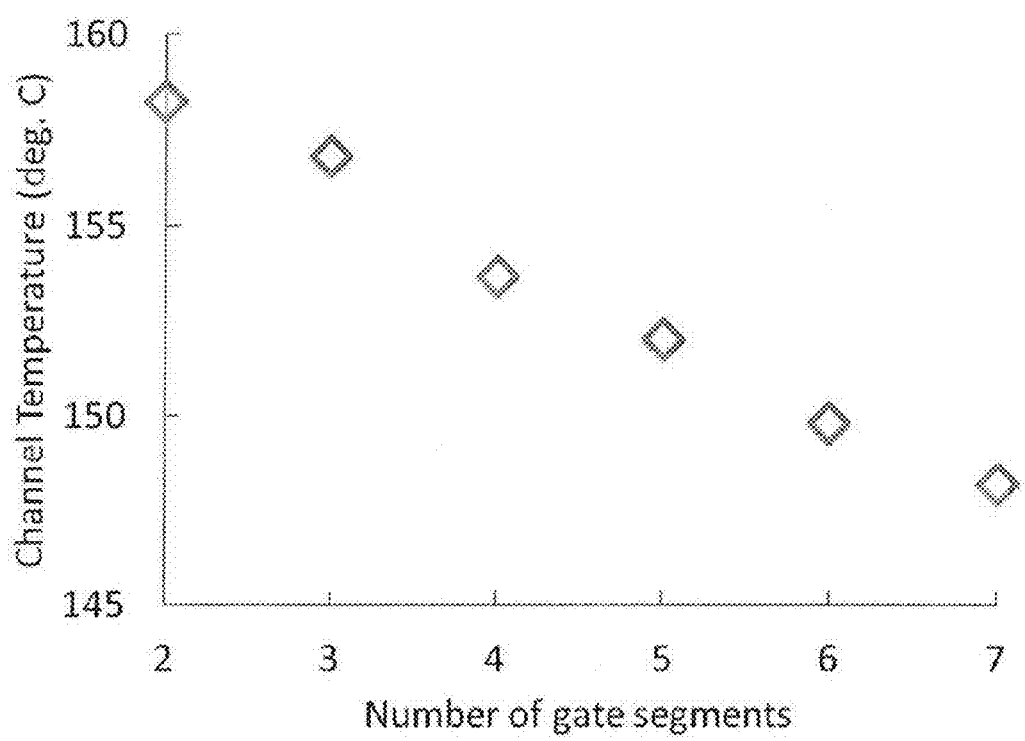
FIG. 7C shows a plot of the maximum channel temperature as a function of the number of segment for a fixed strip width of 150 μm.

FIG. 7C shows a plot of the maximum channel temperature as a function of the number of segment for a fixed strip width of 150 μm. As the plot shows, the temperature decreases with increasing the number of segments.

Experimental Results

Several HEMTs were fabricated by the inventors for evaluation. The HEMTs included AlGaN/GaN HEMT epitaxial layers fabricated on metal organic chemical vapor deposition (MOCVD) grown 3-inch, semi-insulating 6H—SiC substrates. The material has an AlN nucleation layer on SiC substrates. The epitaxial layers consist of an un-doped GaN channel layer, an AlN barrier layer, an un-doped AlGaN layer, and a GaN cap layer. Device isolations were formed by a mesa etch using reactive-ion-etching (RIE). In the inactive regions, the mesa was etched off. A Ti/Al-based metal stack and a Rapid Thermal Anneal (RTA) at 850° C. were used for source and drain ohmic contacts. Contact resistances were measured to be less than 0.4 ohm-mm. $Si_3N_4$ was used for surface passivation. Gate openings were defined by electron-beam (e-beam) lithography. Gates were recessed using an inductively coupled plasma (ICP) etch followed by Pt/Au metal deposition. In the DH-HEMT, the gate islands (inactive regions) can be formed using ohmic metal.

In some instances, it may be more advantageous to add two or more metals deposited in multiple steps to reduce the resistivity. For example, the first metal may be a thin layer of metal, to help the adhesion of the thicker second metal layer onto the surface of the semiconductor material. The second metal layer may be deposited on top of first metal to make it thicker and reduce the metal resistance/loss, thus improving the device electrical performance. The HEMTs were designed for 30 V operation, and small devices (4×50 μm) had power gain of 11.3 dB and power density of 5.6 W/mm at 10 GHz.

HEMTs with a total active gate width of 600 μm (8×75 μm per strip) are described. Data from three DH-HEMTs with gate gaps of 10 μm, 20 μm, and 30 μm is shown.

Figure 8A:
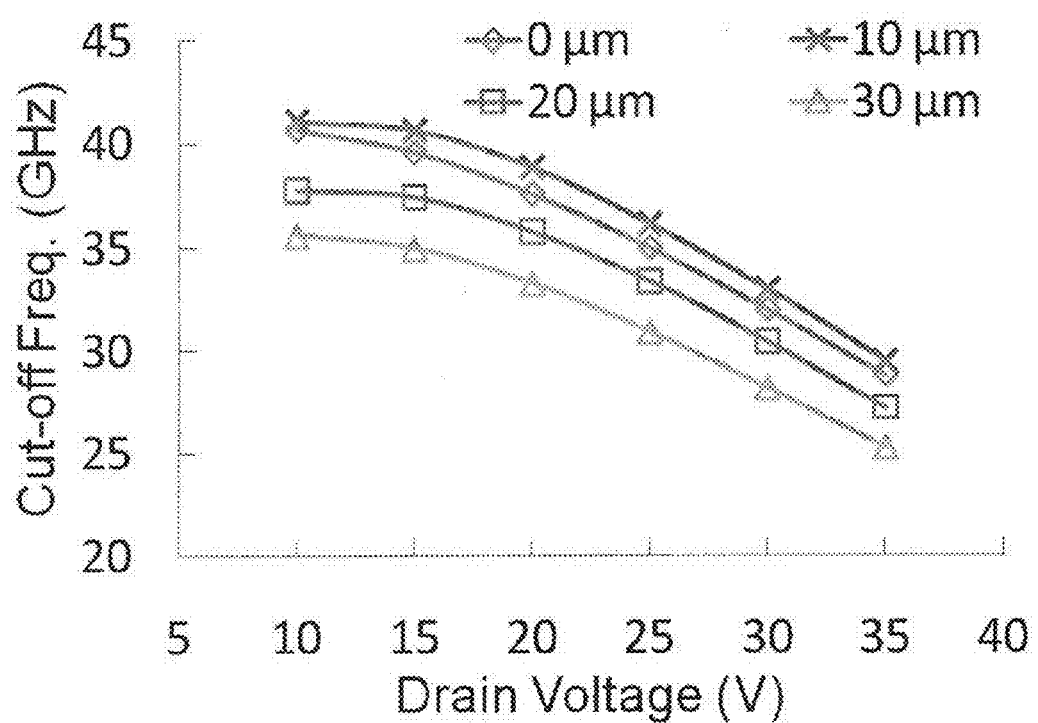
FIG. 8A shows a plot of the cutoff frequency as a function of bias for various DH-HEMTs along with a conventional HEMT.

FIG. 8A shows a plot of the cutoff frequency $f_t$ as a function of bias for the three DH-HEMTs with gate gaps of 10 μm, 20 μm, and 30 μm along with regular conventional HEMT (labeled as 0 μm gap). Here, the drain current was kept constant at 200 mA (40% of $I_{dss}$). An approximate expression for the cutoff frequency is $f_t = g_m/2\pi(C_{gs}+C_{gd})$, where $g_m$ is the transconductance, $C_{gs}$ is the gate-source capacitance, and $C_{gd}$ is the gate-drain capacitance. As the plot shows, $f_t$ drops with increasing drain voltage, because of self-heating, as expected. The bias current was kept constant at 200 mA.

At full bias (approximately 30 V), the difference in $f_t$ between the regular HEMT and the DH-HEMTs is not very significant. In fact, the DH-HEMT with x=10 µm outperforms the regular HEMT. For the DH-HEMTs with x=20 µm, and 30 µm, the larger $C_{gs}$ and $C_{gd}$ result in a lower $f_t$. The equivalent circuit was extracted to find the capacitance dependence on gate gap.

Figure 8B:
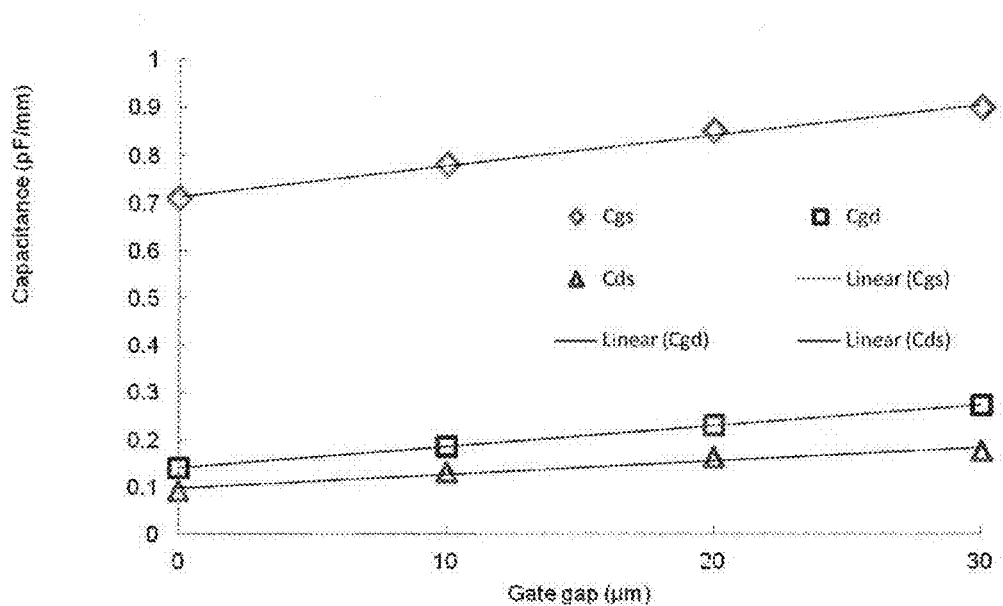
FIG. 8B shows a plot of various extracted capacitance values as a function of the gate inactive section length.

FIG. 8B shows a plot of extracted capacitance values (per mm) for gate-source capacitance $C_{gs}$, gate-drain capacitance $C_{gd}$, and drain-source capacitance, $C_{ds}$ as a function of the gate inactive section length (gap). The capacitances were obtained at 30 V, 200 mA, in all cases.

The increase in capacitances is generally moderate and linear. A linear fit was added to each case. The growth of capacitances can probably be reduced through a more careful layout or the use of some airbridges. Therefore, impedance match to the DH-HEMT is similar to a conventional HEMT. The output power, at 1 dB compression, $P_{1dB}$ of all the devices was measured at 10 GHz using a load pull system.

Figure 9:
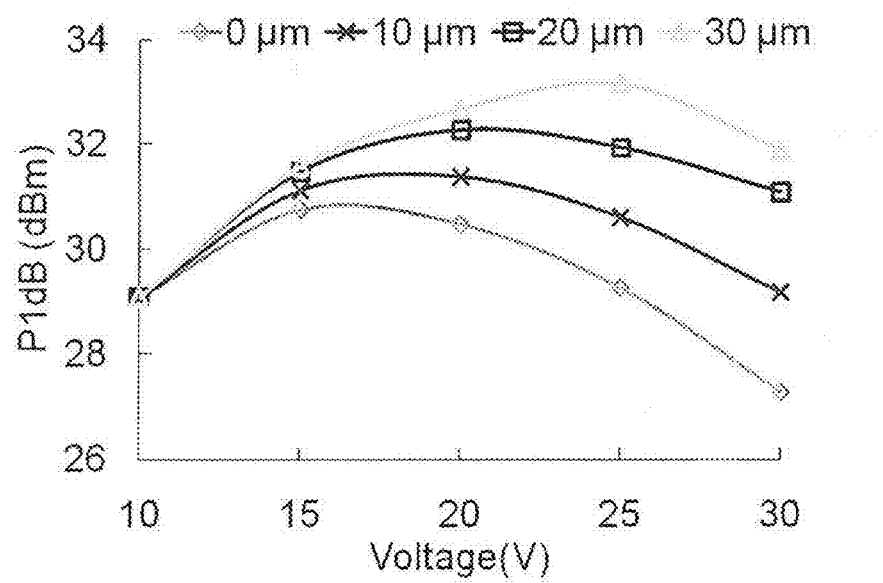
FIG. 9 shows a plot of the change in output power as a function of the drain voltage.
Figure 10:
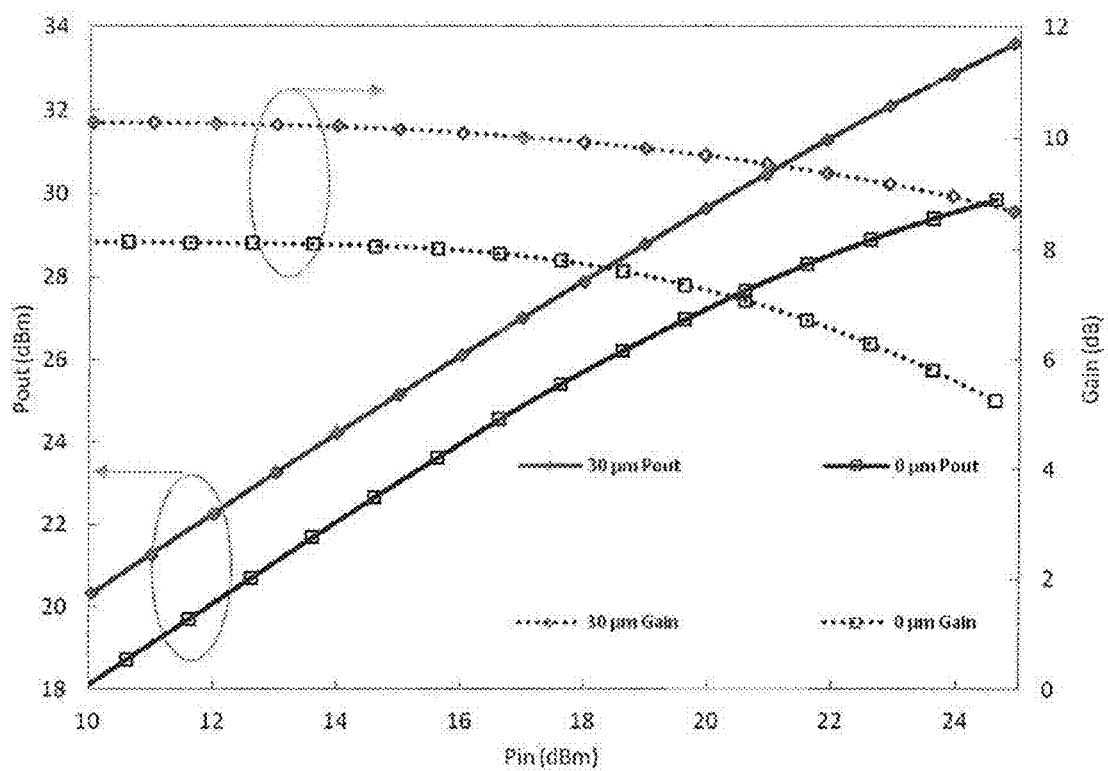
FIG. 10 shows sample power drive curves for a DH-HEMT according to an embodiment of the present invention and a conventional HEMT.

FIG. 9 shows a plot of the change in output power ($P_{1dB}$) as a function of the drain voltage. Several devices of each type were measured, and the performance shown in FIG. 9 was consistently obtained. FIG. 10 shows sample power drive curves for a DH-HEMT having a gate gap of 30 µm and a regular HEMT (labeled as 0 µm gap) at $V_{ds}$=30 V. As apparent, the DH-HEMT consistently outperforms the conventional HEMT at 30 V with the performance showing greater improvements for the devices with lower self-heating.

The results show significant performance enhancement at 10 GHz. Up to 3 dB increase in output power is observed at 30 V bias. Compared to a conventional HEMT, the fabricated DH GaN HEMT demonstrated a decrease in channel temperature from 178° C. to 150° C., accompanied by a 3 dB increase in output power, and a thirteen fold increase in lifetime. The reduction in heating comes at the expense of a moderate increase in device area and capacitance.

While the experiments of the inventors described herein where primary directed to an AlGaN/GaN HEMT devices, it is believed that other semiconductors (e.g., Si, GaAs, SiC, etc.) should provide similar performance for various transistor devices (such as DH-HEMTs and DH-FETs), independent of the fabrication process.

Various transistors may be configured to include a distributed heating transistor according to embodiments of the present invention. In some embodiments, the DH transistor may be configured as a FET, such as a HEMT, a pseudomorphic HEMT (pHEMT), a metal oxide field effect transistor (MOSFET), or a metal semiconductor field effect transistor (MESFET). For example, high-voltage (e.g., 28 V or more) GaAs pseudomorphic HEMT (pHEMT) devices may benefit by the present invention, given that self-heating is the main limiting factor for these devices. In other embodiments, the DH transistor may be configured as a BJT such as a heterojuction bipolar transistor (HBT) which has more significant heating issues compared to FET structures in some instances.

FIG. 11 shows the top view of a conventional FET for comparison sake. In the conventional FET, the transistor action occurs in an area (called active region) where the source, gate, and drain, are in close proximity. The semiconductor region above which the gate is placed may be called a mesa or epitaxial layer, depending on the technology used. Heat is generated along the gate in the active region as electrons flow from the source to the drain via the conductive mesa or epitaxial layer in the direction of the arrow. Electrons can flow across the entire gate strip.

Figure 12A:
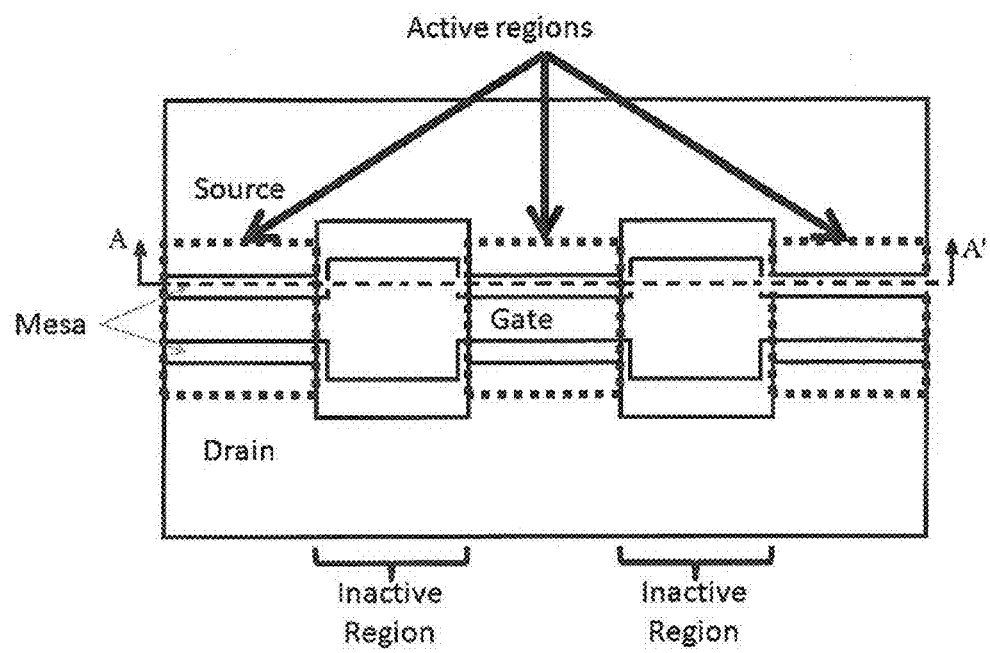
FIGS. 12A-12C show a FET according to embodiments of the present invention.
Figure 12B:
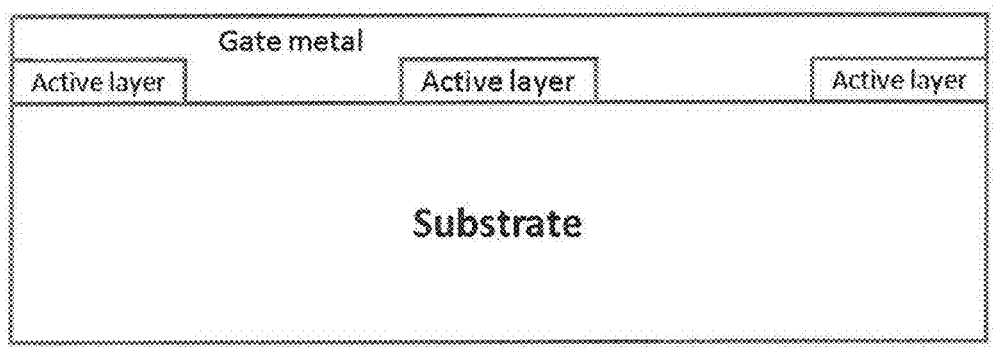
Figure 12C:
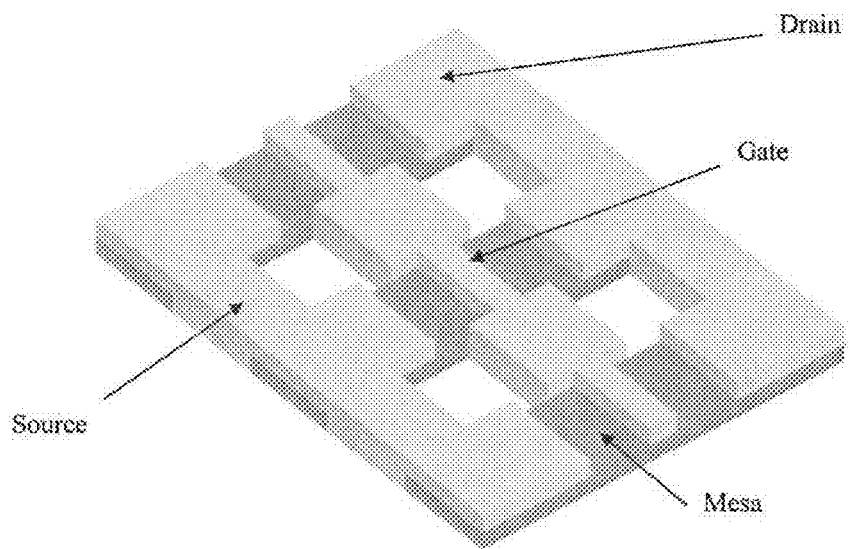

FIGS. 12A-12C show a DH-FET according to embodiments of the present invention. FIG. 12A shows a top view, FIG. 12B shows a cross-sectional view along line A-A' in FIG. 12A and FIG. 12C shows a three-dimensional isometric view. As shown, the active regions and the inactive region form a gate strip.

To reduce the FET's temperature, an improved DH transistor layout is introduced where the active regions (i.e., where heat is generated) are separated by inactive regions (i.e., where no heating happens) in the gate strip, according to embodiments of the present invention. More particularly, the flow of electrons from the source to the drain is permitted in the active regions, while being substantially prevented in the inactive regions. The FET with the improved layout may be referred to as a distributed heating FET transistor because the heat generating areas are distributed over a larger physical area which results in a lower temperature of operation.

FIG. 12A shows certain spaces or voids around the inactive regions of the gate strip. These can occur in BJTs also, see, e.g., FIG. 15. In manufacturing the gate, appropriate masking to ensure continuous gate material should be used.

Moreover, while FIGS. 12A-12C appear to show a planar top surface, in reality, the fabricated transistor device may not be so. Indeed, the figures are not to scale. The thin layers when fabricated may lead to a dimpling effect or slight depression, not shown, in the vicinity of the inactive gate regions because the material may be deposited onto a non-planer (e.g., mesa) surface structure.

Bipolar junction transistors may be similarly improved by using an improved DH transistor layout in which there are active and inactive regions formed in the vicinity of the emitter.

Figure 13:
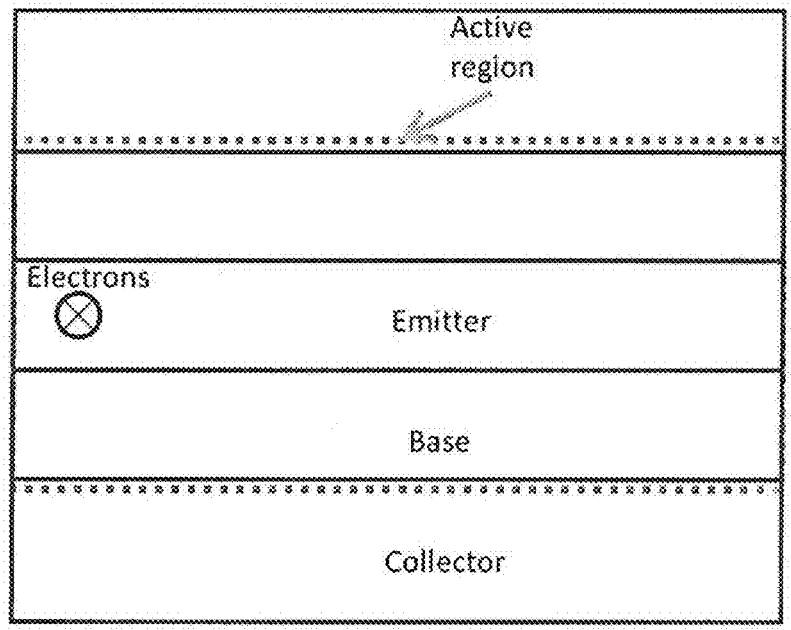
FIG. 13 shows the top view of a conventional BJT.

FIG. 13 shows the top view of a conventional BJT for comparison sake. The conventional BJT generally includes an emitter, resting on a base which, in turn, rests on a collector in a stacked configuration. Here, the transistor action occurs in an area (called the active region—dotted region in the Figure) where the collector, emitter, and base, come in contact. Heat is generated close to the emitter in the active region near the interface with the base and then the collector due to the flow of electrons (or holes) from the emitter to the collector via the base. Electrons can flow from the entire length of the emitter to the collector.

Figure 14A:
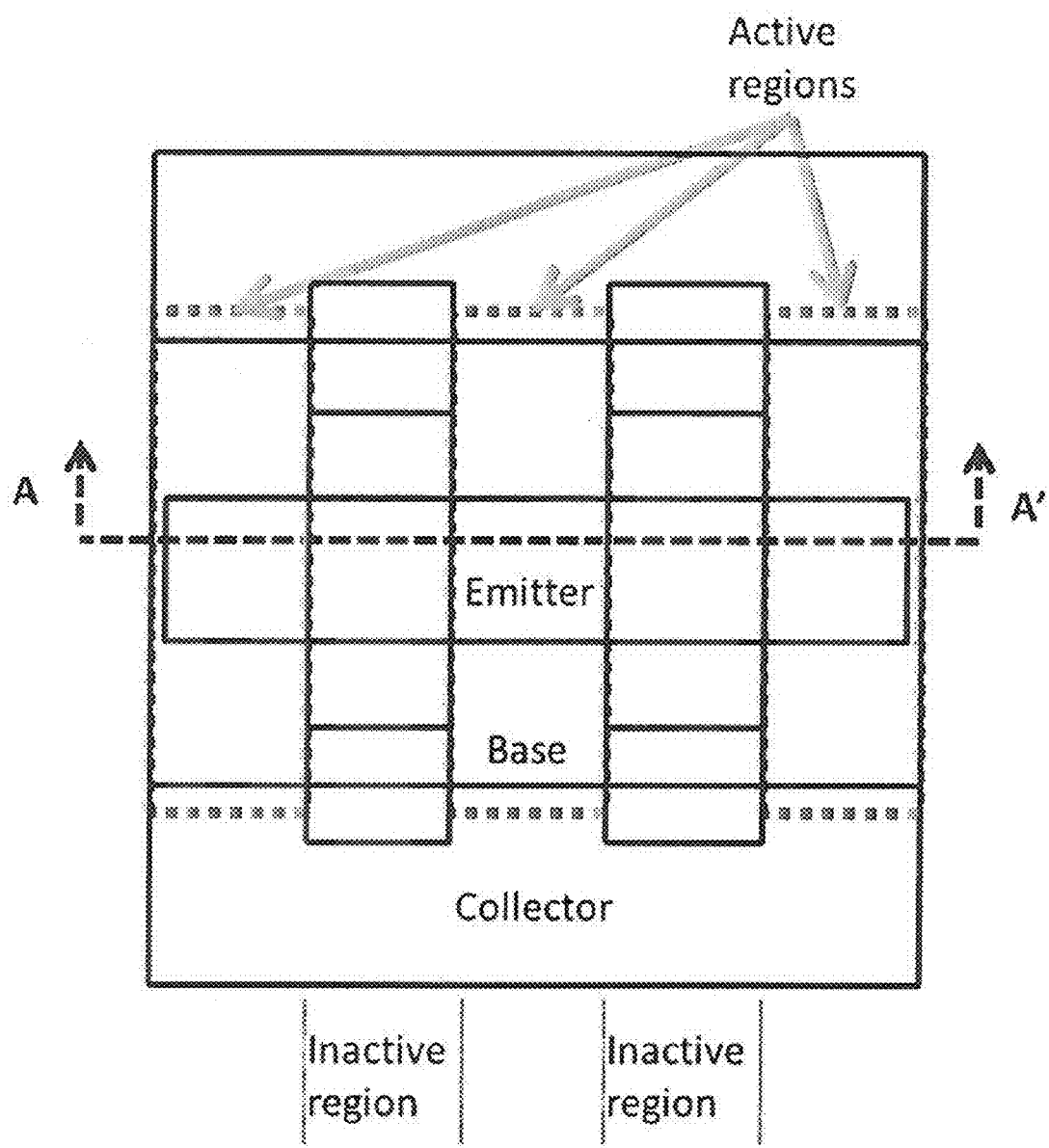
FIGS. 14A-14C show a DH-BJT according to embodiments of the present invention.
Figure 14B:
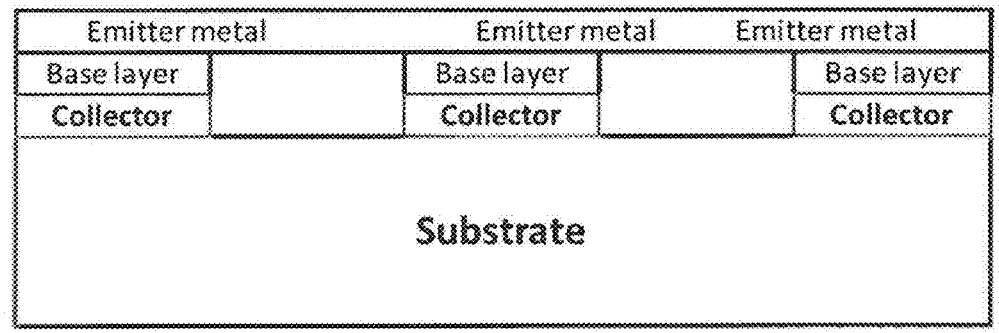
Figure 14C:
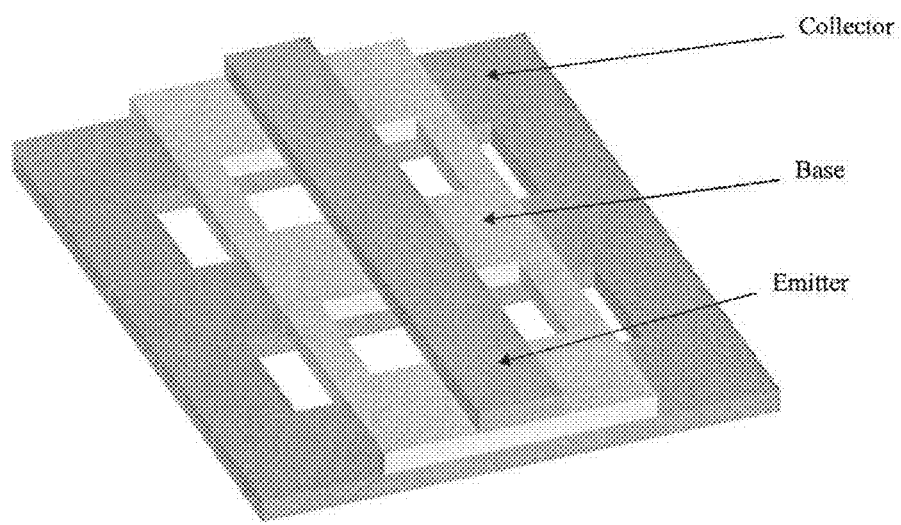

FIGS. 14A-14C show a DH-BJT according to embodiments of the present invention. FIG. 14A shows a top view, FIG. 14B shows a cross-sectional view along line A-A' in FIG. 14A and FIG. 14C shows a three-dimensional isometric view.

The distributed emitter bipolar junction transistor shown is comprised of an emitter finger, resting on a base finger which, in turn, rests on a collector. To reduce BJT's temperature, the DH-BJT layout is introduced where the active regions (i.e., where heat is generated) are separated by inactive regions (i.e., where no heating happens), according to embodiments of the present invention. More particularly, the flow of electrons or holes from the emitter to the collector via the base is permitted in the active regions but substantially prevented in the inactive regions.

The emitter, base and/or collector may be segmented to provide a plurality of active segments with adjacent active segments being separated by an inactive segment. As shown, the base and collector have both been segmented to provide the active segments and inactive segments. The heat generating areas of the DH-BJT are distributed over a larger physical area which results in a lower temperature of operation.

Figure 15:
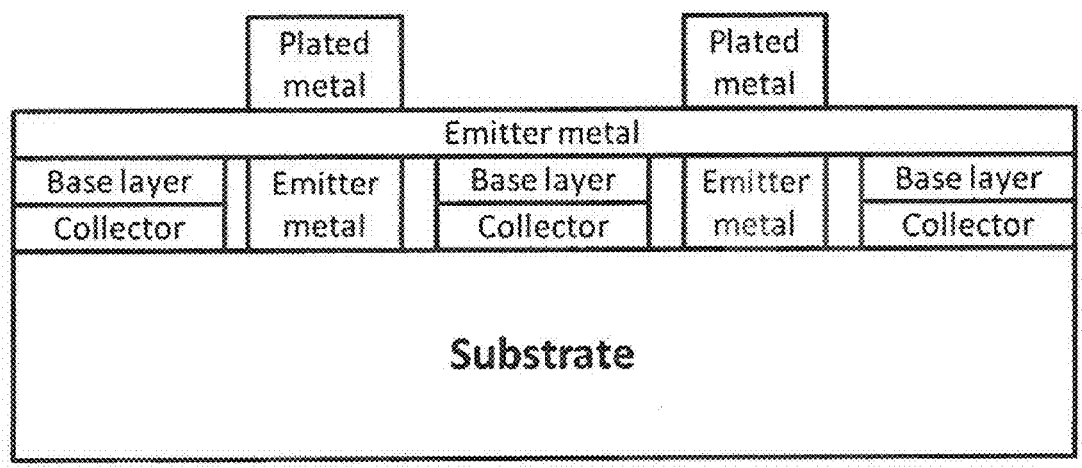
FIG. 15 shows an alternative cross-sectional view of the DH-BJT which may be utilized in some embodiments.

FIG. 15 shows an alternative cross-sectional view of the DH-BJT (as compared to what is illustrated in FIG. 14B) which may be utilized in some embodiments. The substrate here is assumed to be insulating or semi-insulating. Thus, the inactive regions can be filled with emitter material which will not electrically conduct to the substrate. However, if the substrate is conductive or semi-conductive, such as Si-based device, then the metal layer would have to the insulated from the substrate. For instance, an insulating layer may be required. Instead of etching away the inactive regions to formed mesa, ion-implantation or doping may be used to covert active regions into inactive regions during fabrication.

In addition, metal may be plated or otherwise deposited on top of the emitter to reduce emitter resistance in some embodiments. Embodiments of the DH-FET might also include a plated metal layer to reduce the gate resistance.

The DH transistors may be included in various electronic devices. The device may further be provided with matching circuits at the input and output of the device to form an active circuit, such as an amplifier. In some instance, the device and circuits (passive elements) may be fabricated in the same process sequence and on a same chip.

Aspects related to the invention are disclosed in the following article: Darwish, A. M., Hung, H. A., & Ibrahim, A. A., "AlGaN/GaN HEMT With Distributed Gate for Channel Temperature Reduction," IEEE Transactions on Microwave Theory and Techniques, Vol. 60, No. 4, pp. 1038-1043, April 2012 (available online Feb. 17, 2012), herein incorporated by reference in its entirety.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the present disclosure and its practical applications, to thereby enable others skilled in the art to best utilize the invention and various embodiments with various modifications as may be suited to the particular use contemplated.

Various elements, devices, modules and circuits are described above, and associated with their respective functions. These elements, devices, modules and circuits are considered means for performing their respective functions as described herein.

While the foregoing is directed to embodiments of the present invention, other and further embodiments of the invention may be devised without departing from the basic scope thereof, and the scope thereof is determined by the claims that follow.

We claim:

1. A distributed heating transistor comprising:
a plurality of discrete channels; and
an element configured to control transistor action comprising:
first regions positioned proximate to respective channels which control transistor action through the channels; and
at least one second region positioned between adjacent first regions which does not control transistor action, wherein the thickness of the element at the at least one second region is greater than the thickness of the first regions so as to minimize the series resistance of the first regions and the at least one second region.

2. The transistor of claim 1, wherein the transistor is a field effect transistor (FET) comprising:
a source;
a gate; and
a drain,
wherein the element comprises the gate, and heat is generated in the vicinity of the gate due to the flow of electrons or holes from the source to the drain via the gate.

3. The transistor of claim 2, wherein the FET is a high electron mobility transistor (HEMT), a pseudomorphic HEMT (pHEMT), a metal oxide field effect transistor (MOSFET), or a metal semiconductor field effect transistor (MESFET).

4. The transistor of claim 2, wherein the length of the at least one second region in the direction parallel to the channel length is longer than the length of the first regions in the direction parallel to the channel length.

5. The transistor of claim 1, wherein the transistor is a bipolar junction transistor (BJT) comprising:
an emitter;
a base; and
a collector,
wherein the element comprises the emitter, and heat is generated in the vicinity of the emitter due to the flow of electrons or holes from the emitter to the collector via the base.

6. The transistor of claim 5, wherein the BJT is a heterojunction bipolar transistor (HBT).

7. The transistor of claim 1, wherein the at least one second region comprises a conductor.

8. The transistor of claim 1, wherein the at least one second region comprises metal or poly-silicon.

9. The transistor of claim 1, wherein the at least one second region comprises a first metal layer and a second metal layer deposited on the first metal layer.

10. The transistor of claim 1, further comprising: a substrate.

11. An electronic device comprising the distributed gate transistor of claim 1.

12. The transistor of claim 1, wherein the length of the first regions in the direction parallel to the channel length is about 0.1-0.5 μm, and the length of the at least one second region in the direction parallel to the channel length is about 5-10 μm so as to minimize the series resistance of the first regions and the at least one second region.

13. A method of fabricating a distributed heating transistor, the method comprising:
forming a plurality of discrete channels; and
an element configured to control transistor action comprising:
first regions positioned proximate to respective channels which control transistor action through the channels; and
at least one second region positioned between adjacent first regions which does not control transistor action, wherein the thickness of the element at the at least one second region is greater than the thickness of the first regions so as to minimize the series resistance of the first regions and the at least one second region.

14. The method of claim 13, wherein forming the at least one second region comprises:
etching the at least one second region from at least one of the channels.

15. The method of claim 13, wherein forming the discrete channels comprises:
performing ion-implantation or adding a dopant to convert a portion of an active material to an inactive material for separating adjacent channels.

16. The method of claim 13, wherein forming the at least one second region comprises:
depositing a conductor to connect adjacent first regions.

17. The method of claim 16, wherein depositing a conductor comprises:
depositing a first metal; and then depositing a second metal on the first metal.

18. The method of claim 13, further comprising:
forming airbridges covering the first regions.

19. The method of claim 13, wherein the length of the first regions in the direction parallel to the channel length is about 0.1-0.5 µm, and the length of the at least one second region in the direction parallel to the channel length is about 5-10 µm so as to minimize the series resistance of the first regions and the at least one second region.

20. A distributed heating field effect transistor (FET) comprising:
  a plurality of discrete channels between a source and a drain; and
  an gate configured to control transistor action comprising:
    first regions positioned proximate to respective channels having a length parallel to the channel length which control transistor action through the channels; and
    first regions having a length parallel to the channel length which does
  at least one second region positioned between adjacent not control transistor action,
  wherein, the length of the at least one second region is longer than the length of the first regions, the thickness of the at least one second region is greater than the thickness of the first regions, or both, so as to minimize the series resistance of the first regions and the at least one second region.

* * * * *